(12) United States Patent
Tao et al.

(10) Patent No.: US 6,211,574 B1
(45) Date of Patent: Apr. 3, 2001

(54) SEMICONDUCTOR PACKAGE WITH WIRE PROTECTION AND METHOD THEREFOR

(75) Inventors: Su Tao; Chun-Hung Lin; Tai-Chun Huang, all of Kaohsiung (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 09/292,742

(22) Filed: Apr. 16, 1999

(51) Int. Cl.$^7$ ............ H01L 23/48; H01L 23/52; H01L 29/40
(52) U.S. Cl. ............ 257/784; 257/787; 257/667
(58) Field of Search ................. 257/667, 784, 257/787; 438/123, 124

(56) References Cited

U.S. PATENT DOCUMENTS

| | | | | |
|---|---|---|---|---|
| 5,331,205 | * | 7/1994 | Primeaux | 257/790 |
| 5,434,750 | * | 7/1995 | Rostoker et al. | 361/784 |
| 5,847,445 | * | 12/1998 | Wark et al. | 257/669 |
| 5,866,953 | * | 2/1999 | Akram et al. | 257/790 |

FOREIGN PATENT DOCUMENTS 10-347573 * 12/1998 (JP).

* cited by examiner

Primary Examiner—Mahshid Saadat
Assistant Examiner—Jhihan B Clark
(74) Attorney, Agent, or Firm—Dykema Gossett, PLLC

(57) ABSTRACT

A semiconductor package includes a semiconductor die mounted on an upper surface of a substrate. A number of wire bonds electrically connect between a number of bonding pads on the upper surface of the substrate and a number of bonding pads on an upper surface of the semiconductor die. A fixing portion surrounds the semiconductor die and covers a mediate portion of each wire bond. Encapsulating material is molded over the semiconductor die and the wire bonds to form an encapsulant. In an alternative embodiment, the fixing portion is provided on the upper surface of the substrate adjacent to a mold gate of the substrate where the wire sweeping is most likely to occur while molding. The fixing portion does not cover the semiconductor die to avoid thermal strain acting on the semiconductor die due to the different coefficients of thermal expansion between the fixing portion and the encapsulant.

9 Claims, 4 Drawing Sheets

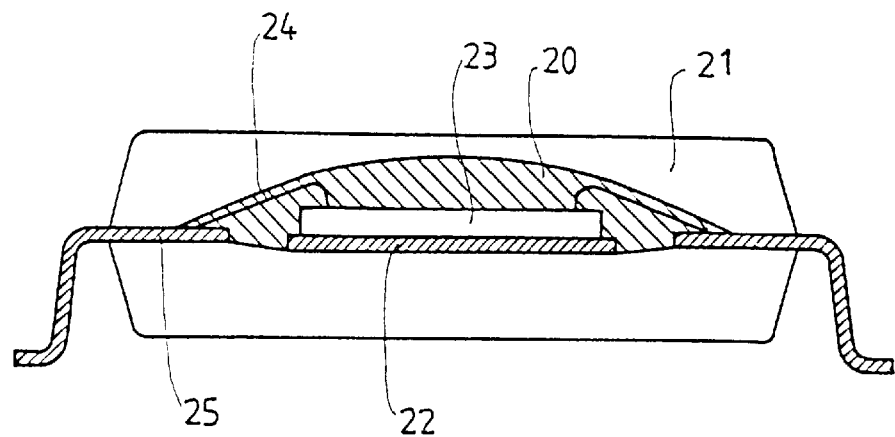
(PRIOR ART) FIG.4
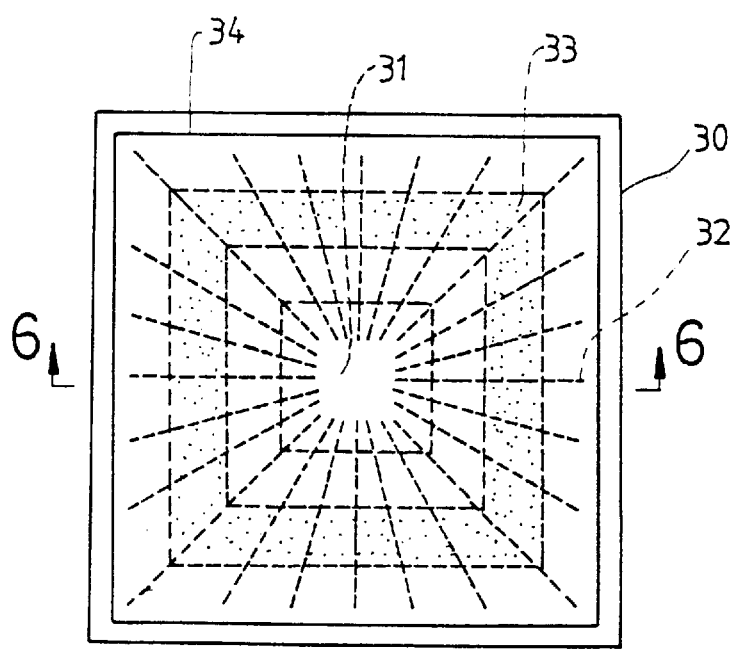
FIG.5

SEMICONDUCTOR PACKAGE WITH WIRE PROTECTION AND METHOD THEREFOR

BACKGROUND OF THE INVENTION

1. Field of the Invention

The present invention relates to a semiconductor package that can prevent wire bonds from shifting during packaging, and more particularly to a semiconductor package that has a fixing portion in the wire bond area to position the wire bonds during packaging a semiconductor die or electric device on the substrate. The present invention also relates to a method of manufacturing a semiconductor package with wire protection to prevent the wire bonds from shifting.

2. Description of the Related Art

When molding encapsulating material for packaging a semiconductor die or an electric device on a substrate, it is found that the encapsulating material in liquid state will sweep the wire bonds and thus causes the wire bonds to contact each other. A closed circuit is formed between the wire bonds such that the semiconductor die or electric device will malfunction or be damaged since short circuit occurs as a result of the undesired closed circuit between the wire bonds. It is, therefore, always desirable to keep the wire bonds away from one another to avoid short circuit of the semiconductor die or electric device.

Taiwan Utility Model Publication No. 347573 issued on Dec. 11, 1998 discloses a method of protecting the wire bonds, and such method is illustrated in FIGS. 1 through 3 of the drawings. FIG. 1 illustrates that a semiconductor die 11 is mounted on a substrate 10, and a plurality of wire bonds 12 extend outwardly from the semiconductor die 11 to provide electrical connection between the substrate 10 and the semiconductor die 11. FIG. 2 illustrates spraying of the adhesive over the wire bonds 12 so as to reduce the exposed length of the wire bond 12. As shown in FIG. 3, when the adhesive 13 diffuses, the adhesive 13 flows outwardly to cover the wire bond 12. However, it takes a relatively long time to spray, diffuse and harden the adhesive 13.

U.S. Pat. No. 5,331,205 to Primeaux issued on Jul. 19, 1994 discloses a mold plastic package with wire protection to solve the wire sweep problem. As shown in FIG. 4, the mold plastic package includes an encapsulating material 20, a package body 21, a semiconductor die 23, a plurality of wire bonds 24, and a lead frame 26 with a plurality of leads 25. The semiconductor die 23 is mounted on a die pad 22 of the lead frame 26 and includes a plurality of bonding pads (not shown). The wire bonds 24 each provides an electrical connection between the bonding pads of the semiconductor die 23 and the leads 25 of the lead frame 26. The encapsulating material 20 that has a low coefficient of thermal expansion encapsulates the upper face of the semiconductor die 23 and all of the wire bonds 24. The package body 21 encapsulates the die 23, portions of the leads 25, and the encapsulating material 20. It is, however, found that hardening of the encapsulating material 20 still takes a long time since it must cover the die 23 and the wire bonds 24.

It is, therefore, a long and unfulfilled need to provide a semiconductor package with wire protection and with short hardening time for the encapsulating material.

SUMMARY OF THE INVENTION

It is a primary object of the present invention to provide a semiconductor package with wire protection to prevent the wire bonds from shifting and a method for manufacturing the semiconductor package with wire protection. A portion of a wire bond area of the substrate is provided with a fixing portion to shorten the hardening time for the fixing material forming the fixing portion, thereby saving the hardening time for the fixing portion.

It is a secondary object of the present invention to provide a semiconductor package with wire protection to prevent the wire bonds from shifting and a method for manufacturing the semiconductor package with wire protection. The fixing portion does not cover the semiconductor die so as to avoid the thermal strain on the semiconductor die due to the different coefficients of thermal expansion between the fixing portion and the semiconductor package. When the wire bond sweeping problem is eliminated, the encapsulating conditions and parameters will not be limited.

According to the the method of the present invention, a fixing material is provided in a wire bonds area on an upper surface of the substrate adjacent to the semiconductor die. The hardened fixing material forms a fixing portion for insulating and separating wire bonds. Then, an encapsulating material is molded surrounding the semiconductor die and the wire bonds to form an encapsulant.

In a preferred embodiment of the present invention, a semiconductor die or electric device is mounted on an upper surface of a substrate. A plurality wire bonds electrically connect between a plurality of bonding pads on the upper surface of the substrate and a plurality of bonding pads on an upper surface of the semiconductor die. The fixing portion is disposed surrounding the semiconductor die and covers a main portion (the mediate section) of each wire bond, since the mediate sections of the wire bonds are tended to contact one another as a result of wire sweeping.

In another preferred embodiment of the present invention, a semiconductor die or electric device is mounted on an upper surface of a substrate. A plurality of wire bonds electrically connect between a plurality of bonding pads on the upper surface of the substrate and a plurality of bonding pads on an upper surface of the semiconductor die. A first fixing portion is provided on the upper face of the substrate adjacent to a mold gate where the wire sweeping is most likely to occur while molding. A second fixing portion is provided on the upper surface of the substrate in an area opposite to the mold gate where the wire sweeping is also likely to occur.

Since the present invention disposes the fixing portion at the area surrounding the semiconductor die or the area near the mold gate for fixing and insulating mediate sections of the wire bonds, the time for hardening the fixing material at the fixing portion is relatively shortened. In addition, since the fixing portion does not cover the semiconductor die, the thermal strain acting on the semiconductor die due to different coefficients of thermal expansion between the fixing portion and the semiconductor package is eliminated.

Other objects, advantages, and novel features of the invention will become more apparent from the following detailed description when taken in conjunction with the accompanied drawings.

BRIEF DESCRIPTION OF THE DRAWINGS

FIG. 4 is a sectional view of a semiconductor package disclosed in U.S. Pat. No. 5,331,205;

FIG. 5 is a top view of a first preferred embodiment of a semiconductor package in accordance with the present invention;

DETAILED DESCRIPTION OF THE PREFERRED EMBODIMENTS

Figure 6:
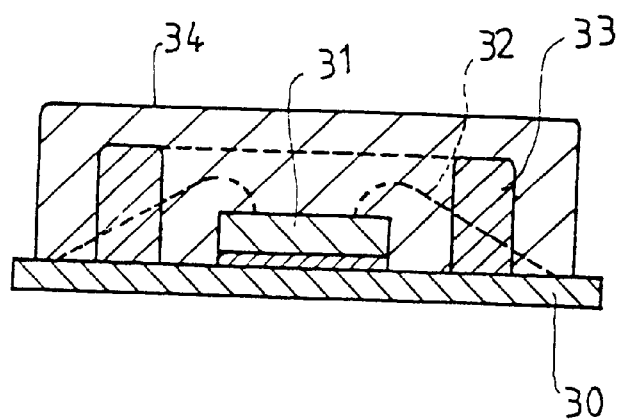
FIG. 6 is a sectional view taken along line 6—6 in FIG. 5.

Referring to FIGS. 5 and 6, a first embodiment of a semiconductor package in accordance with the present invention generally includes a substrate 30, a semiconductor die 31, a plurality of wire bonds 32, and a fixing portion 33. The semiconductor die 31 is mounted on an upper face of the substrate 30. The wire bonds 32 are electrically connected between a plurality of bonding pads (not labeled) on the upper surface of the substrate 30 and a plurality of bonding pads (not labeled) on an upper surface of the semiconductor die 31. The fixing portion 33 is formed by epoxy resin having a low coefficient of thermal expansion and is provided on the upper surface of the substrate 30 surrounding the semiconductor die 31. The fixing portion 33 covers a main portion of each wire bond 32, which is the mediate section of the wire bond 32 and is tended to contact with one another as a result of wire sweeping. It is appreciated that neither the proximal ends of the wire bonds 32 electrically connected to the bonding pads on semiconductor die 31 nor the distal ends of the wire bonds 32 electrically connected to the bonding pads on the substrate 30 are covered by the fixing portion 33. Namely, the fixing portion 33 only covers a portion of the upper surface of the substrate 30 such that the amount of material for the fixing portion 33 is relatively reduced as compared with the conventional art. After the fixing portion 33 is hardened, an encapsulating material is molded over the semiconductor die 31, wire bonds 32 and fixing portion 33 to form an encapsulant 34.

Figure 1:
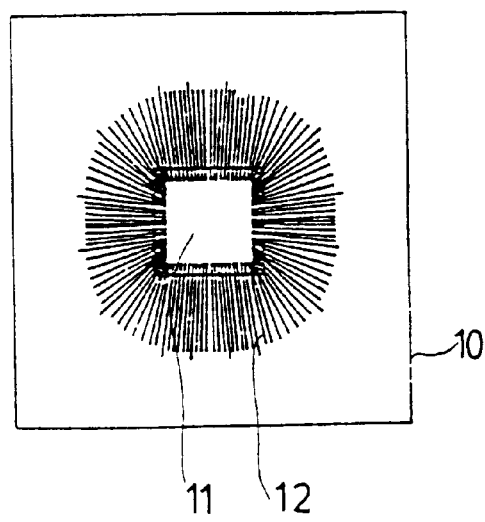
FIG. 1 is a top view of a semiconductor package disclosed in Taiwan Utility Model Publication No. 347573 before spraying of encapsulant material.
Figure 2:
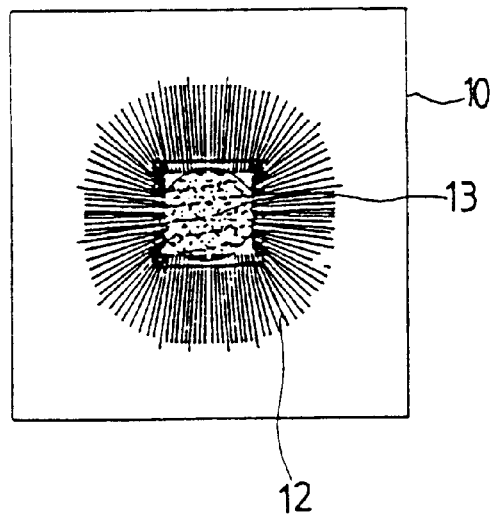
FIG. 2 is a view similar to FIG. 1, illustrating spraying of the encapsulant material.
Figure 3:
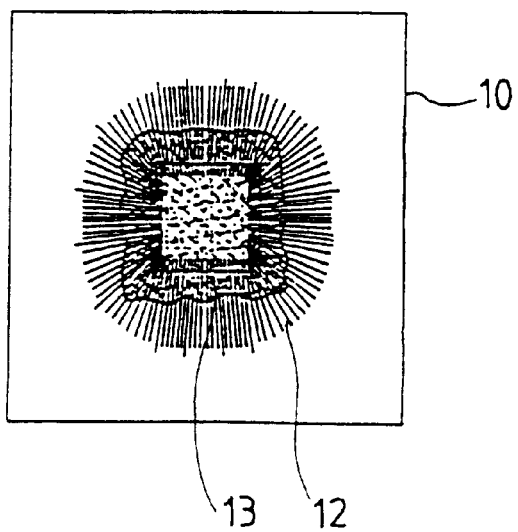
FIG. 3 is a view similar to FIG. 2, illustrating the spread of the encapsulant material.

Comparing the semiconductor package in FIGS. 5 and 6 with the semiconductor packages in FIGS. 1 and 4, the amount of the material, epoxy resin, required for forming the fixing portion 33 of the present invention is less than both the encapsulating material 13 of Taiwan Utility Model Publication No. 347573 and the encapsulating material 20 of U.S. Pat. No. 5,331,205. In addition, the hardening time for the fixing portion 33 of the present invention is shorter than both the encapsulating material 13 and the encapsulating material 20 of Taiwan Utility Model Publication No. 347573 and U.S. Pat. No. 5,331,205 respectively. Furthermore, the wire sweeping problem of the bond wires 32 is avoided. Unlike the semiconductor die 11 disclosed in Taiwan Utility Model Publication No. 347573 and the semiconductor die 23 disclosed in U.S. Pat. No. 5,331,205, since the semiconductor die 31 is not covered by the fixing portion 33, the thermal strain acting on the semiconductor die due to different coefficient of thermal expansion between the fixing portion 31 and the encapsulant 34 is eliminated.

Figure 7:
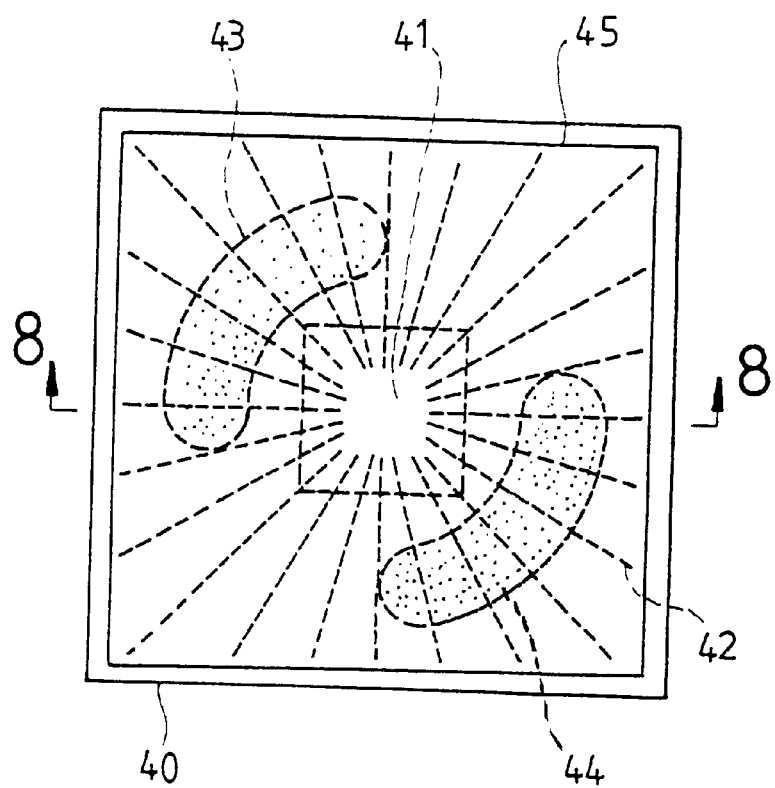
FIG. 7 is a top view of a second preferred embodiment of the semiconductor package in accordance with the present invention.
Figure 8:
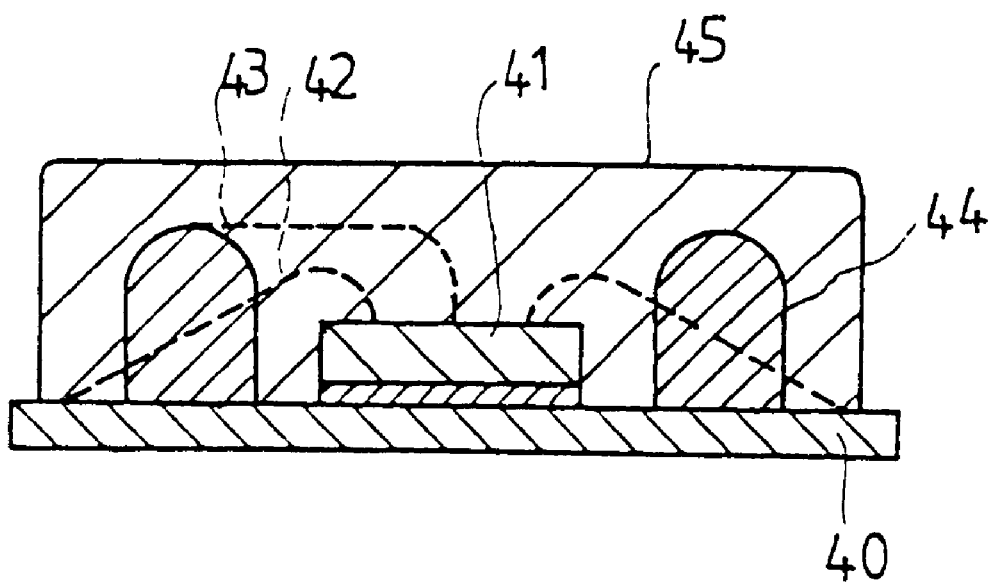
FIG. 8 is a sectional view taken along line 8—8 in FIG. 7.

Referring to FIGS. 7 and 8, a second embodiment of the semiconductor package of the present invention includes a substrate 40, a semiconductor die 41, a plurality of wire bonds 42, a first fixing portion 43, and a second fixing portion 44. The semiconductor die 41 is mounted on an upper surface of the substrate 40. The wire bonds 42 are electrically connected between a plurality of bonding pads (not labeled) on the upper surface of the substrate 40 and a plurality of bonding pads (not labeled) on an upper surface of the semiconductor die 41.

The first fixing portion 43 is provided on the upper surface of the substrate 40 adjacent to a mold gate (not labeled) of the substrate 40 where the wire sweeping is most likely to occur while molding. Namely, the first fixing portion 43 covers and thus positions the mediate sections of the wire bonds that locate around the mold gate area of the upper surface of the substrate 40. The second fixing portion 44 is provided on the upper surface of the substrate 40 in an area opposite to the mold gate where wire sweep is also likely to occur while molding. Namely, the second fixing portion 44 covers and thus positions the mediate sections of the wire bonds 42 that locate around the area of the upper surface of the substrate opposite to the mold gate. It is appreciated that the first fixing portion 43 and the second fixing portion 44 do not cover the other wire bonds 42, which sustain smaller sweeping force while packaging.

It is appreciated that the distal ends of the wire bonds electrically connected to the bonding pads on the substrate 40 are not covered by the first fixing portion 43 and the second fixing portion 44. Namely, the first and second fixing portions 43 and 44 only cover a portion of the upper surface of the substrate 40 such that the amount of the fixing material, epoxy resin, for the first and second fixing portions 43 and 44 is relatively reduced. After the fixing portions 43 and 44 are hardened, an encapsulating material is molded over the semiconductor die 41, the wire bonds 42, the first fixing portion 43 and second fixing portion 44 to form an encapsulant 45.

Comparing the semiconductor package in FIGS. 7 and 8 with the semiconductor packages in FIGS. 1 and 4, the amount of the fixing material, epoxy resin, required for forming the first and second fixing portions 43 and 44 of the present invention is less than both the encapsulating material 13 of Taiwan Utility Model Publication No. 347573 and the encapsulating material 20 of U.S. Pat. No. 5,331,205. In addition, the hardening time for the first and second fixing portions 43 and 44 is shorter than both the encapsulating material 13 and the encapsulating material 20. Furthermore, the wire sweeping problem of the bond wires 42 are avoided. Unlike the semiconductor die 11 disclosed in Taiwan Utility Model Publication No. 347573 and the semiconductor die 23 disclosed in U.S. Pat. No. 5,331,205, since the semiconductor die 41 is not covered by the first and second fixing portions 43 and 44, the thermal strain acting on the semiconductor die 41 due to different coefficient of thermal expansion between the first and second fixing portions 43 and 44 and the encapsulant 34 is eliminated.

Referring to FIGS. 5 and 7, a method of manufacturing a semiconductor package with wire protection in accordance with the present invention includes the steps of forming a fixing portion 33 (or a first fixing portion 43 and a second fixing portion 44) in a wire bonds area adjacent to the semiconductor die 31, 41. After the fixing portion 33 (or the first fixing portion 43 and the second fixing portion 44) is hardened, an encapsulating material is molded to cover the semiconductor die 31, 41 to form an encapsulant 34, 45.

Although the invention has been explained in relation to its preferred embodiment, it is to be understood that many other possible modifications and variations can be made without departing from the spirit and scope of the invention as hereinafter claimed.

What is claimed is:

1. A semiconductor package with wire protection, the semiconductor package comprising:

a substrate including an upper surface;

a semiconductor die mounted on the upper surface of the substrate, the semiconductor die including an upper face;

a plurality of wire bonds each having a first end connected to the upper surface of the substrate and a second end connected to the upper surface of the semiconductor die; and a fixing portion formed on the upper surface of the substrate adjacent to the semiconductor die for fixing and protecting the wire bonds;

wherein only the mediate sections of the wire bonds are covered by the fixed portion.

2. The semiconductor package with wire protection as claimed in claim 1, wherein the fixing portion surrounds the semiconductor die.

3. The semiconductor package with wire protection as claimed in claim 1, wherein the fixing portion is made of a material having a low coefficient of thermal expansion.

4. The semiconductor package with wire protection as claimed in claim 1, wherein the fixing portion is made of epoxy resin.

5. The semiconductor package with wire protection as claimed in claim 1, wherein the semiconductor die is not covered by the fixing portion.

6. A semiconductor package with wire protection, the semiconductor package comprising:

a substrate including an upper surface with a mold gate;

a semiconductor die mounted on the upper surface of the substrate, the semiconductor die including an upper surface;

a plurality of wire bonds having a first end connected to the upper surface of the substrate and a second end connected to the upper surface of the semiconductor die; and a fixing portion formed on the upper surface of the substrate intermediate the mold gate and the semiconductor die, wherein each of said wire bonds includes two ends and a mediate portion, and only the mediate portion is covered by the fixing portion.

7. The semiconductor package with wire protection as claimed in claim 6, further comprising a second fixing portion formed on the upper surface of the substrate in an area opposite to the mold gate.

8. The semiconductor package with wire protection as claimed in claim 6, wherein the fixing portion is made of a material having a low coefficient of thermal expansion.

9. The semiconductor package with wire protection as claimed in claim 6, wherein the fixing portion is made of epoxy resin.

* * * * *